United States Patent [19]

Murai et al.

[11] Patent Number: 5,250,812
[45] Date of Patent: Oct. 5, 1993

[54] ELECTRON BEAM LITHOGRAPHY USING AN APERTURE HAVING AN ARRAY OF REPEATED UNIT PATTERNS

[75] Inventors: Fumio Murai, Nishitama; Shinji Okazaki, Urawa; Haruo Yoda, Nishitama; Yukinobu Shibata, Ibaraki; Akira Tsukizoe, Koganei, all of Japan

[73] Assignee: Hitachi, Ltd., Tokyo, Japan

[21] Appl. No.: 858,868

[22] Filed: Mar. 27, 1992

[30] Foreign Application Priority Data

Mar. 29, 1991 [JP] Japan ..................................... 3-66218
Aug. 28, 1991 [JP] Japan ..................................... 3-217227

[51] Int. Cl.$^5$ ............................................. H01J 37/04
[52] U.S. Cl. ..................... 250/492.2; 250/398
[58] Field of Search .............. 250/492.2 R, 492.22, 250/492.23, 396 R, 398, 492.3

[56] References Cited

U.S. PATENT DOCUMENTS 4,243,866  1/1981  Pfeiffer et al. .................. 250/396 R
5,036,209  7/1991  Kataoka et al. .................. 250/492.2

FOREIGN PATENT DOCUMENTS 62-260322  12/1987  Japan .

OTHER PUBLICATIONS

Ouyou Buturi Yokoushy (Preliminary Transaction of Applied Physics) 27a-K-5 to 27a-K-7, 1989 Autum pp. 451–452 (English translation) p. 4 only.
Proc. of 1990 Intern. Microprocess Conference pp. 44–47.

Primary Examiner—Jack I. Berman
Assistant Examiner—Jim Beyer
Attorney, Agent, or Firm—Fay, Sharpe, Beall, Fagan, Minnich & McKee

[57] ABSTRACT

An electron beam lithography apparatus is disclosed which has an aperture plate provided with an aperture including an array of repeated unit patterns and an ordinary aperture of a rectangular shape. A region free of the influence of a proximity effect is delineated using the former aperture, and a region affected by the proximity effect is delineated using the latter aperture. The number of repeated unit patterns included in the former aperture is determined considering the number of repeated unit patterns included in a pattern array to be delineated on a substrate. Thereby, the number of electron beam shots is reduced. A plurality of apertures having slightly different aperture widths may be provided for always keeping a pattern line width constant.

19 Claims, 11 Drawing Sheets

FIG. IA
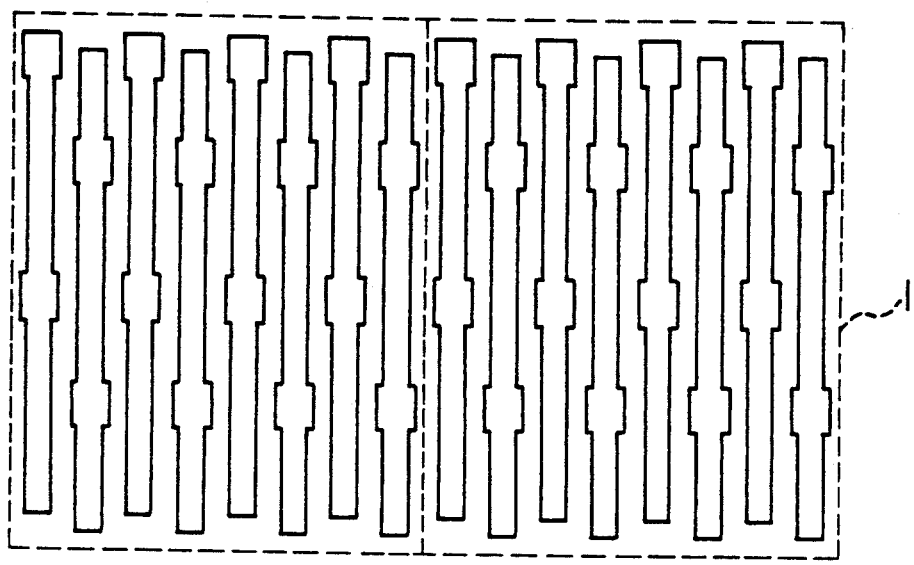
FIG. IB
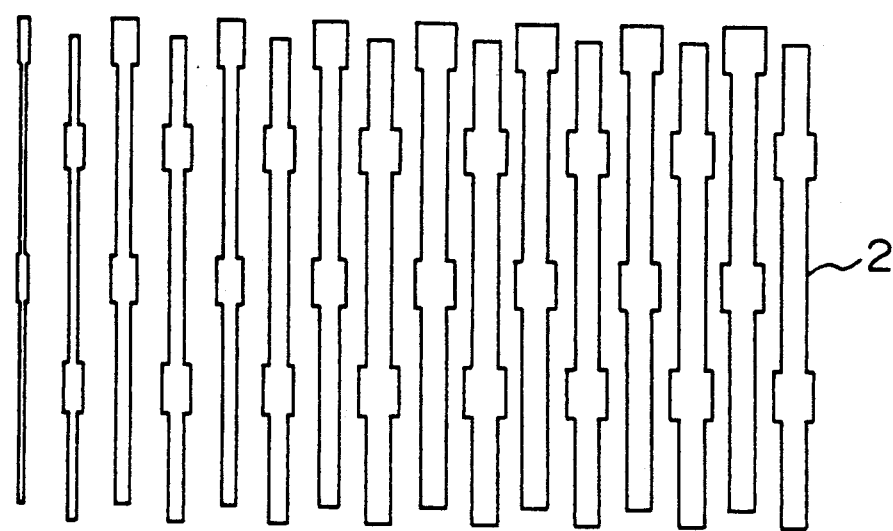

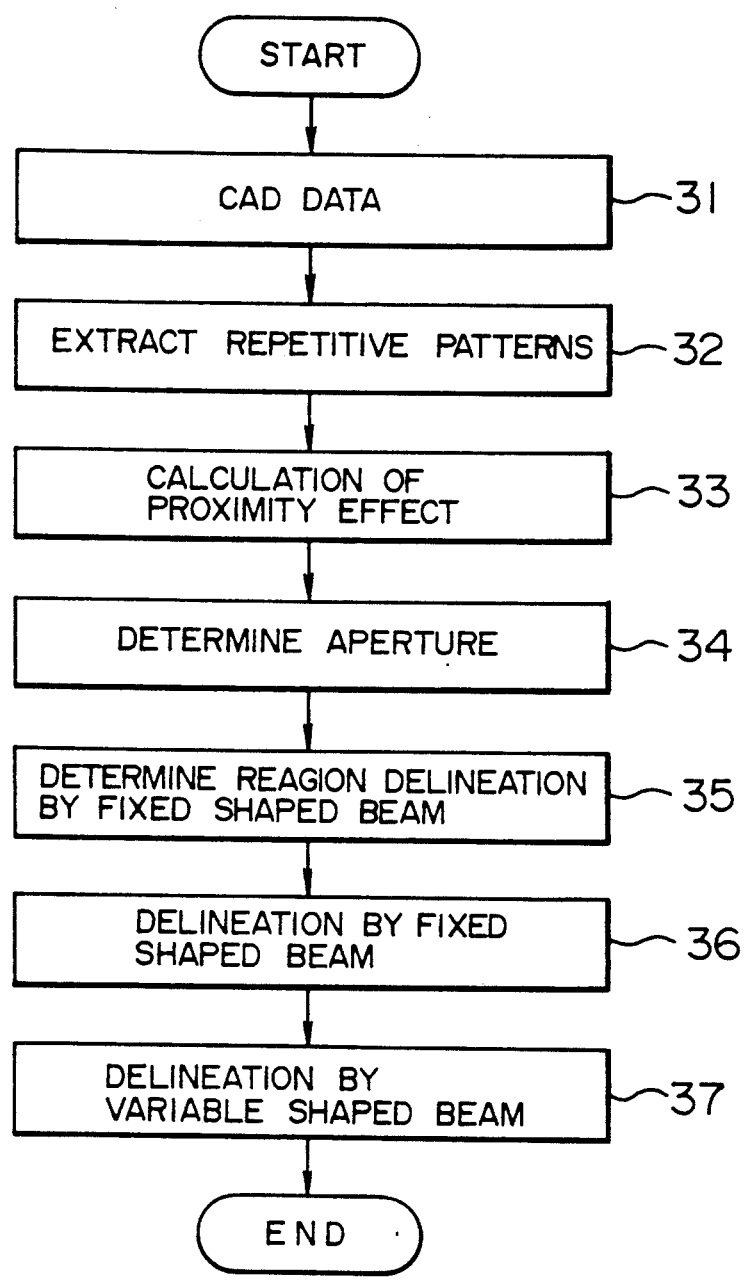

ELECTRON BEAM LITHOGRAPHY USING AN APERTURE HAVING AN ARRAY OF REPEATED UNIT PATTERNS

BACKGROUND OF THE INVENTION

The present invention relates to an electron beam lithography method and apparatus, and more particularly to an electron beam lithography method and apparatus in which patterns periodically repeated in an LSI circuit or the like are delineated or written at high speed and with high accuracy.

An electron beam lithography method is a technique indispensable to the research and development of most advanced devices because of a feature that minute patterns can be formed with no mask. However, there is a problem that the throughput is low since the patterns are successively delineated. In order to greatly improve the throughput, JP-A-62-260322 has proposed a method in which an aperture of an electron beam lithography apparatus includes an array of unit patterns repeatedly arranged. An electron beam emitted from an electron beam source is passed through this aperture so that a substrate is irradiated with an electron beam shaped through the aperture (hereinafter referred to as a fixed shaped beam) for pattern delineation.

The present inventors have examined the above electron beam lithography method and have found out the following new problems.

In the fixed shaped beam, it is not possible to change the beam exposure intensity (or the quantity of beam radiation) within one exposure shot. An inconvenience caused by this fact appears, for example, at the periphery portion of a semiconductor memory cell array as shown in FIG. 1. For example, when a 64 Mbit cell pattern is delineated, eight wiring patterns (corresponding to a 32-bit memory portion) are included in one shot of a fixed shaped beam of 7 μm square, as shown in FIG. 1A. In the outermost periphery of the memory cell array shown in FIG. 1B, the pattern density has a large change. Therefore, there is a problem that in the 7 μm square, a pattern 2 on the outermost periphery has a lack of exposure due to a proximity effect and hence the accuracy in dimension is deteriorated.

Also, in the prior art, the number of minimum units or unit patterns repeatedly arranged in the aperture is not taken into consideration. However, this number of unit patterns in the aperture has an important significance in improving the throughput.

Further, the present inventors have revealed that it does not always follow that the line width of a pattern delineated on the substrate has a one-to-one correspondence to the aperture width (or the width of an opening) of the above aperture. This can be considered to be caused by an influence of the type or thickness of a resist on a substrate.

SUMMARY OF THE INVENTION

Accordingly, an object of the invention is to solve at least one of the above problems.

Another object of the present invention is to provide an electron beam lithography method and apparatus in which the throughput is improved.

Still another object of the present invention is to provide an electron beam lithography method and apparatus which can prevent the deterioration of the accuracy in dimension which may be caused at the periphery of an array of repeated patterns in the case where the fixed shaped beam is used.

A further object of the present invention is to provide an aperture plate capable of obtaining fixed shaped beams which allow easy control of the dimension of a pattern to be formed.

A still further object of the present invention is to provide an electron beam lithography apparatus in which such an aperture plate is incorporated.

A furthermore object of the present invention is to provide a semiconductor device fabricating method which uses such an aperture plate.

To attain at least one of the above objects, the present invention is provided with a construction in which a fixed shaped beam and a variable shaped beam can be formed in one electron beam lithography apparatus. An electron beam emitted from an electron beam source (or a first electron beam) is passed through a first aperture or opening to form the fixed shaped beam (or a second electron beam). The first aperture is formed by an array of repeated unit patterns, which is a unit aperture, of any predetermined shape. The shape of the cross section of the fixed shaped beam is fixed in accordance with the shape of the first aperture. The variable shaped beam (or a third electron beam) is formed by passing the first electron beam through a second aperture which can change the shape of the cross section of the first electron beam.

Depending on the material of a substrate and the density of patterns, a proximity effect may give an influence on patterns. The influence of the proximity effect strongly appears at the periphery of a pattern array formed on the substrate. Therefore, according to one aspect of the present invention, a pattern region uniformly affected by the proximity effect is delineated using a fixed shaped beam the exposure of which is constant, and a pattern region greatly and non-uniformly affected by the proximity effect is delineated using a variable shaped beam while adjusting the exposure thereof. Incidentally, a region moderately affected by the proximity effect is delineated using a fixed shaped beam the exposure intensity of which is adjusted.

According to another aspect of the present invention, an aperture for forming a fixed shaped beam is made to be at a maximum in a range where the first electron beam has a uniform current density. Namely, the number of unit patterns included in the aperture is selected to be at the maximum. As a result, the number of shots of a fixed shaped beam is reduced, thereby improving the throughput. However, when a pattern array on a substrate cannot be divided by the pattern formed by the maximum aperture, an aperture is made small so that the pattern array can be divided by the pattern formed by the aperture. Namely, an aperture is defined such that the number of repeated unit patterns included in the aperture is selected to be 1/m (m: natural number) of the number of repeated unit patterns forming the pattern array (each of which unit patterns is a reduced version of a unit pattern in the aperture) on the substrate. Thereby, the throughput is improved.

According to a further aspect of the present invention, a plurality of apertures, which have identical shapes but slightly different aperture widths, are formed in one aperture plate so that one among the plurality of apertures can be selected properly in accordance with the kind and/or thickness of a resist on a substrate. Thereby, it is possible to keep a pattern line width constant. Since the plurality of apertures are formed in one aperture plate, the aperture selection can be made rapidly, thereby making it possible to prevent the throughput from being lowered.

BRIEF DESCRIPTION OF THE DRAWINGS

These and other objects and technical advantages of the present invention will be readily apparent from the following description of the preferred exemplary embodiments of the invention in conjunction with the accompanying drawings, in which FIG. 1A is a diagram showing the shape of the cross section of a fixed shaped beam;

FIG. 1B is a diagram showing the influence of a proximity effect;

FIGS. 3 and 4A to 4C concern an embodiment of an electron beam lithography method according to the present invention, more particularly, FIG. 3 being a flow chart showing the procedure of the method, FIG. 4A being a plan view showing a unit pattern, FIG. 4B being a plan view showing an aperture, and FIG. 4C being a plan view showing a pattern array;

DESCRIPTION OF THE PREFERRED EMBODIMENTS

Figure 2:
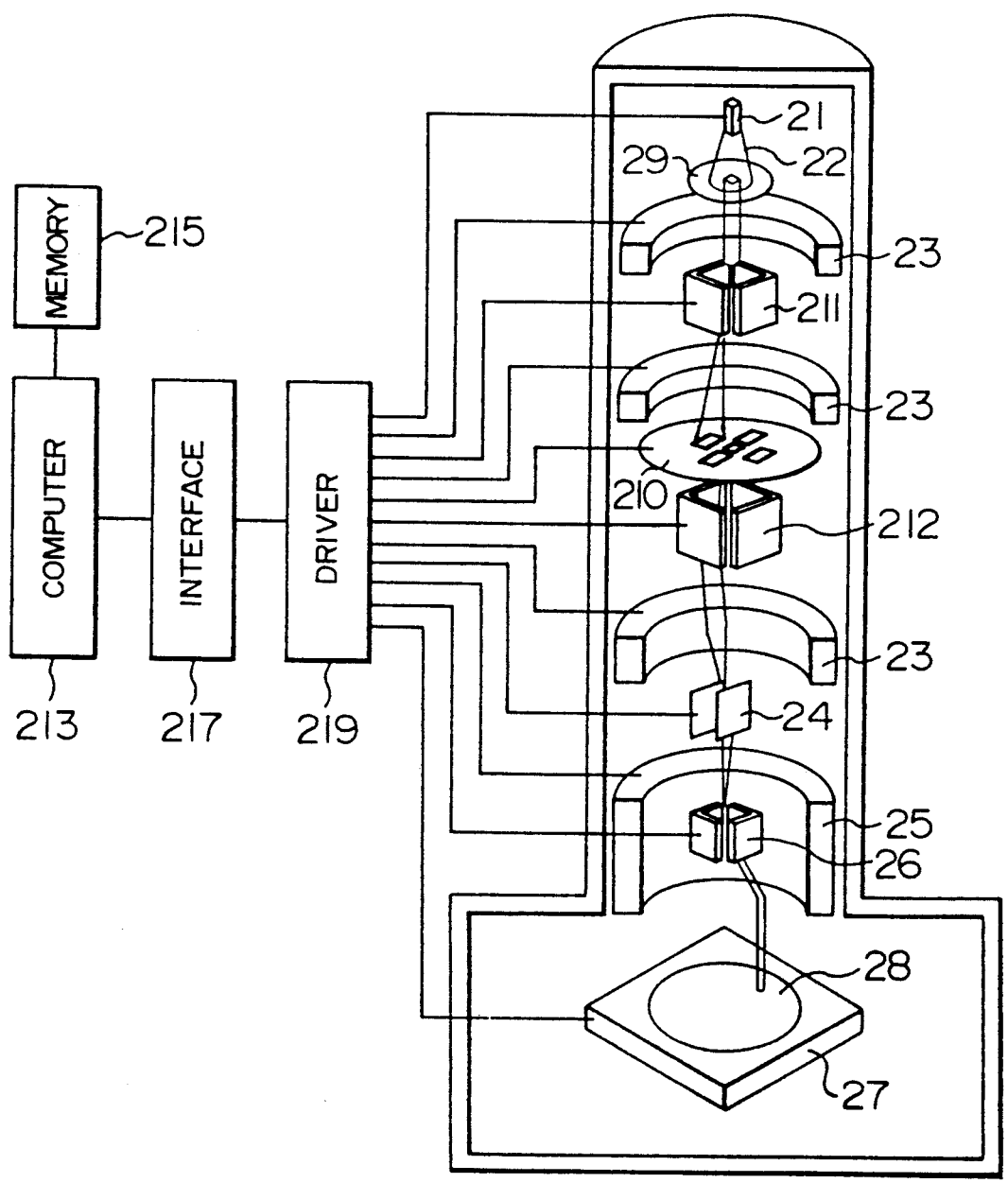
FIG. 2 is a schematic diagram of an embodiment of an electron beam lithography apparatus according to the present invention.

FIG. 2 shows a schematic diagram of an embodiment of an electron beam lithography apparatus according to the present invention. An electron beam 22 emitted from an electron gun 21 is focused by a plurality of electron lenses 23 and 24 and deflected by deflection lenses 25 and 26 to irradiate a wafer 28 on a movable stage 27. The shape of the beam is determined by two aperture plates which include a first aperture plate 29 and a second aperture plate 210. The second aperture plate 210 is provided with apertures which will be explained later on. Any aperture in the second aperture plate 210 is selected by electron beam shaping lense 211 to form any fixed shaped electron beam. Also, a rectangular aperture is provided at a central portion of the second aperture plate 210 so that a variable shaped beam is formed according to conventional practice.

FIGS. 3, 4 and 5 show an embodiment of an electron beam lithography method of the present invention in the case where it is applied to an LSI for MOS random access memory (DRAM). FIG. 3 is a flow chart for producing delineation data. First, LSI design data is given as CAD (computer aided design) data (step 31). The CAD data is stored in, for example, a memory 215 (see FIG. 2). In general, the CAD data includes data of non-repetitive patterns (or random patterns) and data of repetitive patterns having unit patterns repeated at a coordinate and a pitch designated. In step 32, only the repetitive patterns are extracted from the CAD data.

Figure 4A:
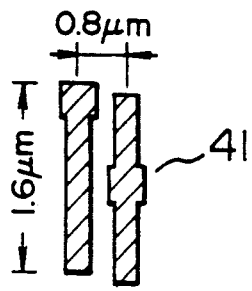

In the present embodiment, it is assumed for the convenience of explanation that the CAD data consists of only the repetitive pattern data. A patter array 43 delineated on the basis of the CAD data in that case is shown in FIG. 4C.

Figure 6:
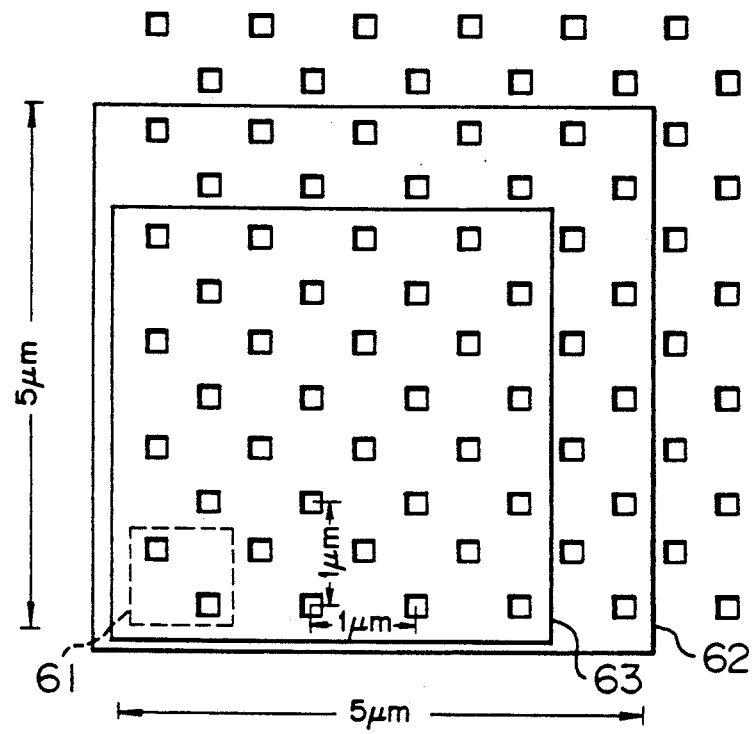
FIGS. 6 and 7 are diagrams showing apertures in other embodiments of the present invention.

In step 33, a computer 213 (see FIG. 2) calculates the influence of a proximity effect in the pattern array on the basis of the CAD data. In the case where repeated unit patterns 41 have a high density, as shown in FIG. 4A, it is known that the proximity effect becomes uniform at the periphery of the pattern array 43. The computer 213 also determines the width of a periphery portion where the proximity effect is not uniform. A frame 44 shown in FIG. 4C represents a boundary of that periphery portion. If the unit pattern is one as shown in FIG. 6, the frame 44 coincides with the outer margin of the pattern array 43 since the influence of the proximity effect can be ignored.

In step 34, the computer 213 processes the repetitive pattern data to determine the shape and size of each of repeated unit patterns which form an aperture and the number of the repeated unit patterns in the aperture in each of a longitudinal direction and a lateral direction.

After the aperture has been determined, the maximum region 45 is determined which can be formed through repeated irradiation by a fixed shaped beam formed through the aperture (step 35). The region 45 cannot extend out of the frame 44.

Process steps 31 to 35 of FIG. 3 can be previously executed by another computer system which is different from the computer 213 in FIG. 2.

In order to reduce the number of shots of the fixed shaped beam as small as possible, it is preferable to make the frame 44 and the boundary of the region 45 coincident with each other. A first requirement for that purpose is that an area inside the frame 44 can be divided by the shape of the cross section of an electron beam with which a substrate is irradiated through the aperture. In FIG. 4C, the shape of the cross section of the electron beam is represented by a small rectangle. A second requirement is that the aperture is made the maximum in a range where a first electron beam emitted from the electron gun 21 has a uniform current density. When it is not possible to design the aperture such that the area inside the frame 44 can be divided or when the number of repeated unit patterns forming the aperture is remarkably small even if the area can be divided, an aperture is designed so as to satisfy only the second requirement. Thus, steps 34 and 35 are performed always in parallel. The processes in steps 34 and 35 are performed by the computer 213.

There may be the case where one pattern array to be delineated on the substrate includes a plurality of kinds of unit patterns. In that case, the above processing is performed for each unit pattern.

Next or in step 36, the region 45 is delineated using the aperture determined in the above steps. Subsequently, the remaining region is delineated using a variable shaped beam (step 37).

Figure 4B:
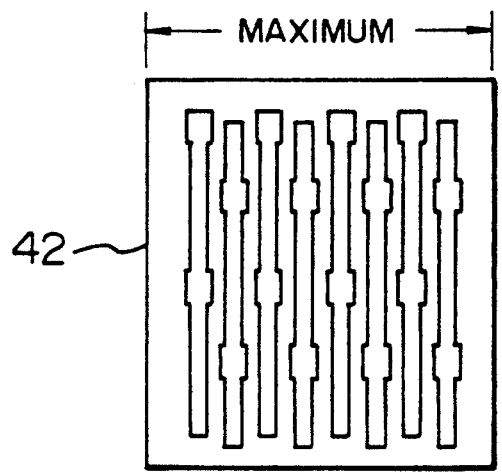
Figure 4C:
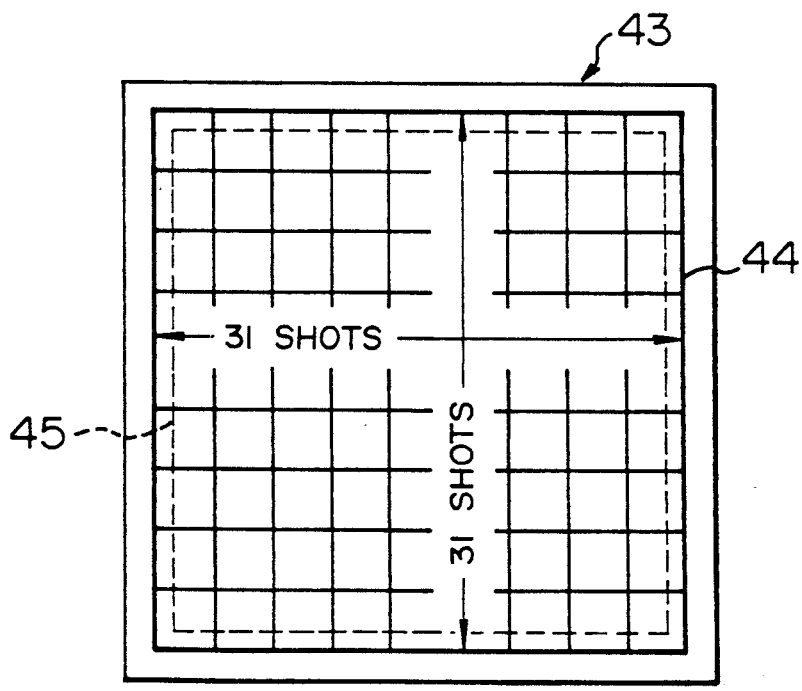

The unit pattern and the aperture used in the above lithography method are shown in FIGS. 4A and 4B. More particularly, FIG. 4A shows a pattern 41 (for four bits) of wiring of a memory cell of LSI for DRAM. The unit patterns 41 are regularly arranged at pitches of 0.8 $\mu$m and 1.6 $\mu$m in X and Y directions. In a 7 $\mu$m square, which is the maximum of a size in which a uniform beam is available, are arranged $4\times2$ unit patterns 41 to obtain an aperture 42. Namely, one shot of the fixed shaped beam corresponds to a 32-bit memory. In the LSI of the present embodiment, since 32 Kbits are constructed as a memory mat having the repetition of the same pattern, the region 44 of the memory mat is delineated with $31\times31$ shots of the fixed shaped beam. Patterns on the periphery portion of the memory mat are delineated using a variable shaped beam.

Figure 5A:
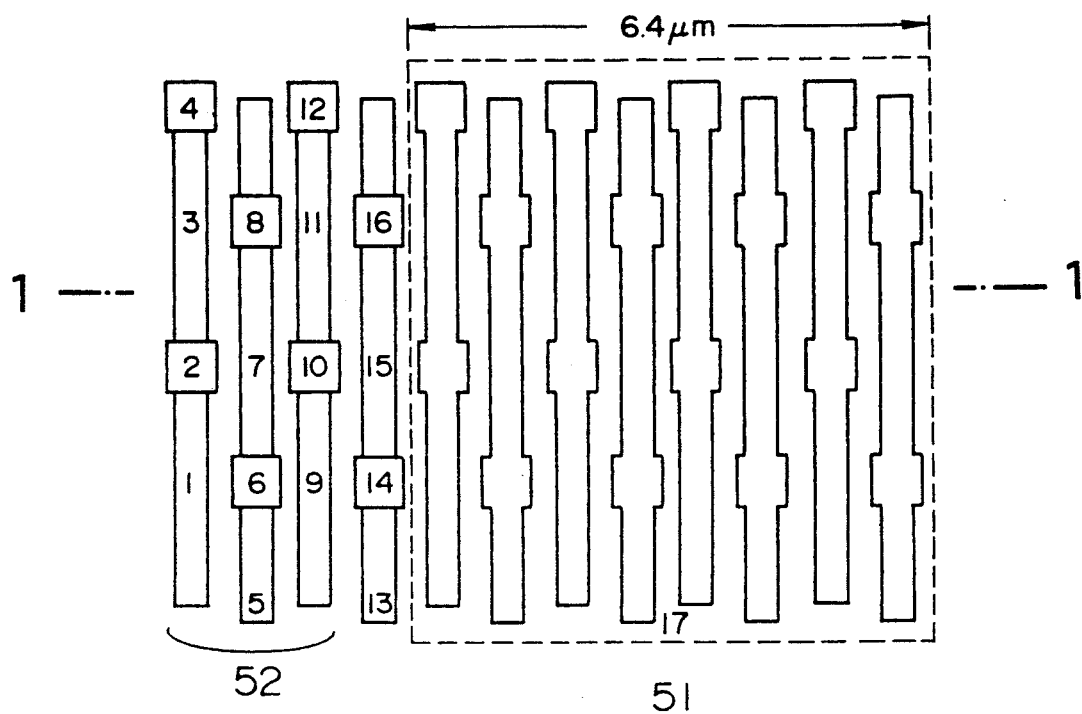
FIG. 5A is a plan view showing one shot of a fixed shaped beam and 16 shots of a variable shaped beam.
Figure 5B:
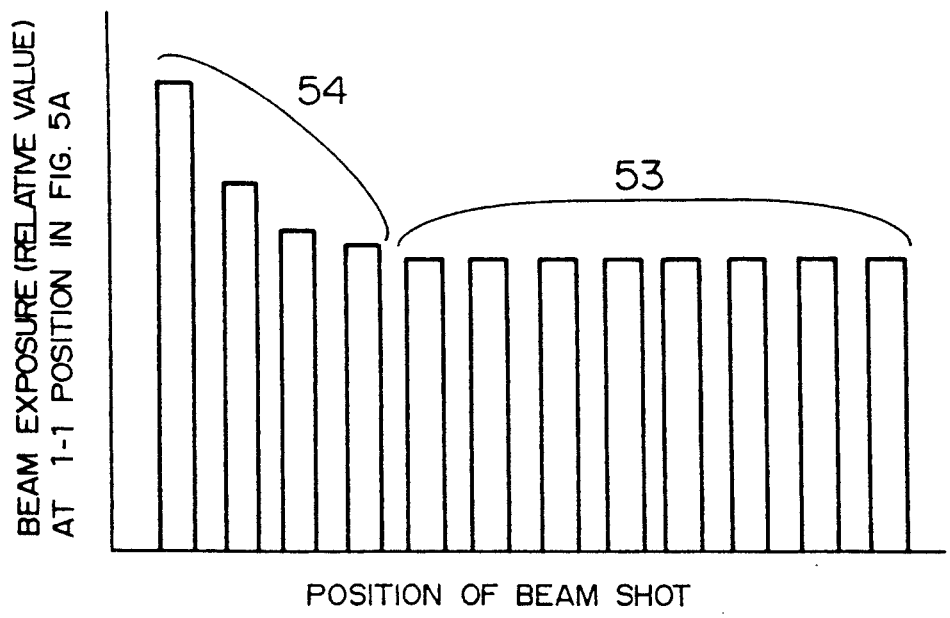
FIG. 5B is a diagram showing the exposure of each beam taken along a position shown by line 1—1 in FIG. 5A.

Next, explanation will be made of electron beam exposure or irradiation at the periphery portion and the exposure supplied for each shot. FIG. 5A shows a region 51 delineated by a fixed shaped beam of 6.4 $\mu$m square and a region 52 on the periphery portion delineated by a variable shaped beam. The region 52 delineated by the variable shaped beam requires 16 shots, as represented by numerals shown in patterns. On the other hand, in the region delineated by the fixed shaped beam, an area twice as large as the region 52 can be delineated by one shot. The relative value of the exposure supplied to each shot along the position shown in line 1—1 in FIG. 5A is shown in FIG. 5B. In one shot of the fixed shaped beam, it is not possible to change the exposure. Therefore, the exposure is uniform, as shown by 53 in FIG. 5B. At the periphery portion of the memory mat, however, a shortage from the optimum exposure is caused by the so-called proximity effect since the pattern density becomes low. In the present embodiment, the delineation of the periphery portion by the variable shaped beam makes it possible to make the exposure at the periphery larger in accordance with the decrease in pattern density, as shown by 54 in FIG. 5B. In a substrate on which a material such as tungsten greatly affected by the proximity effect is deposited, finer adjustment of the exposure as in the present embodiment becomes necessary.

FIG. 6 shows an aperture in another embodiment in which a fixed shaped beam is applied to a contact hole pattern. In this case, a pattern density in a pattern array is low and the influence of the proximity effect is not so large. Therefore, the present embodiment will be shown as an example of the case where the improvement of the throughput to the highest is intended.

As shown in FIG. 6, unit patterns 61 are repeatedly arranged at pitches of 1 $\mu$m and 1 $\mu$m in X and Y directions and the number of repeated unit patterns 61 in the pattern array is 64 in the X direction and 64 in the Y direction. In the present embodiment, the maximum size of an electron beam is a 5 $\mu$m square. Therefore, the maximum number of unit patterns, which can be formed in an aperture 62, is $5\times5$. In this case, the number of shots of a fixed shaped beam is $12\times12=144$ since the division of the size (64 $\mu$m$\times$64 $\mu$m) of the pattern array by the beam size (5 $\mu$m$\times$5 $\mu$m) results in 64 $\mu$m$=5$ $\mu$m$\times12+4$ $\mu$m in each of the X and Y directions. The remaining patterns corresponding to the length of 4 $\mu$m in each of the X and Y directions will be delineated by a variable shaped beam and the number of shots of the variable shaped beam will be 992. Accordingly, the total number of shots will amount to 1136.

On the other hand, if the number of unit patterns to be formed in an aperture is selected to be $4\times4$ which is one sixteenth or in general 1/m (m: natural number) of the number $64\times64$ of repeated unit patterns in the pattern array, 256 ($=16\times16$) shots suffice for all of regions 63 or the whole of the pattern array. Namely, the delineation can be completed with the number of shots reduced to one fourth of that required in the case where the maximum size of beam is used.

Generally, in many cases, an LSI memory pattern forms a memory mat in the form of an array of $2^n$ memory cells (n: natural number). Therefore, it is preferable that $2^n$ unit figures or patterns are arranged in an aperture with n selected to be the maximum value of n with which $2^n$ unit patterns can fall within the aperture. However, when the number of repeated unit patterns is very large, there may be the case where the above-mentioned relation in number of shots is reversed. In such a case, the maximum number of unit patterns are arranged in an aperture. And, if m times (m: natural number) of the number of repeated unit patterns arranged in the aperture does not coincide with the number of repeated unit patterns included in a pattern array, the remaining or excess patterns are delineated by a variable shaped beam.

Figure 7:
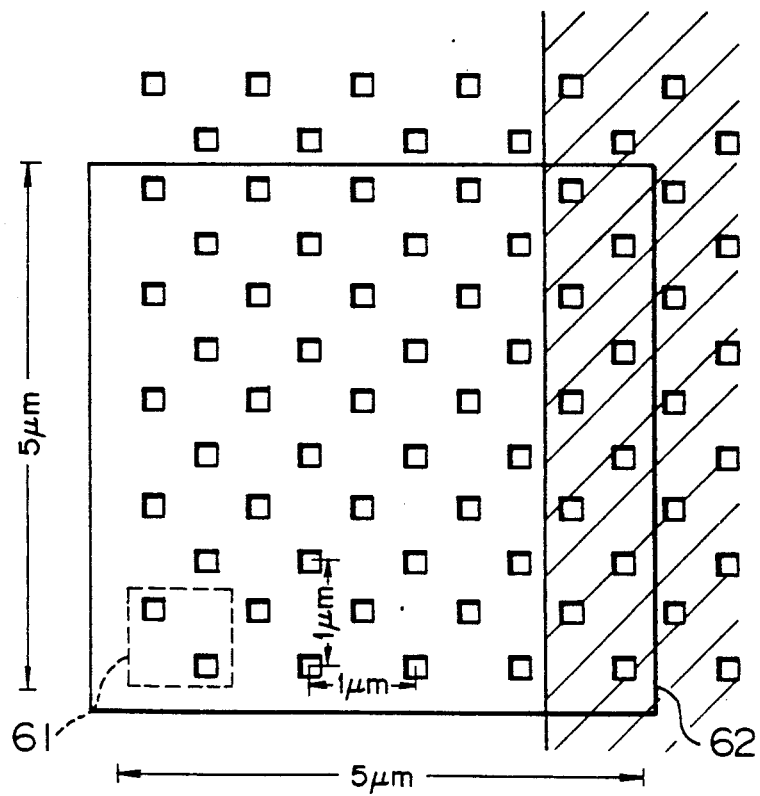

FIG. 7 shows an example in which the shape of the cross section of a fixed shaped beam is modified into a shape inclusive of $4\times5$ unit patterns by shadowing a part of a first electron beam (or a beam emitted from the electron gun 21) by means of a well known method. If a periphery portion in the example shown in conjunction with FIG. 6 is delineated by use of the fixed shaped beam thus obtained, the number of shots can be reduced.

Figure 8:
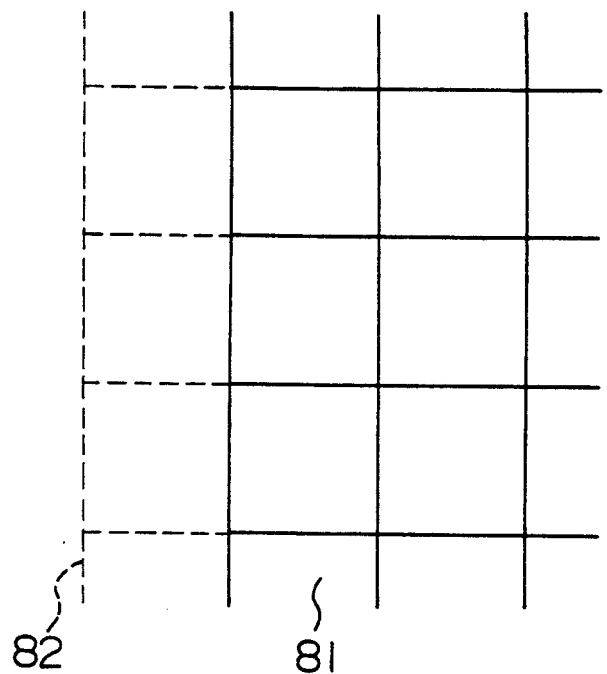
FIG. 8 is a diagram showing another embodiment of an electron beam lithography method according to the present invention.

FIG. 8 is a diagram for explaining another measure to counter the effect of the proximity effect. A region 81 shown by solid line in FIG. 8 represents an effective pattern array which performs a function as a device. A region 82 shown by dotted line in FIG. 8 is an auxiliary region which is delineated in contiguity to the periphery of the effective region 81 in order that the influence of the proximity effect does not appear at the periphery of the effective region 81. Accordingly, there results in that the influence of the proximity effect makes an appearance in the auxiliary region 82. With a view to reduce the number of shots, the whole pattern area including the auxiliary region 82 and the effective region 81 can be delineated by use of an aperture including an array of repeated unit patterns, that is, by use of only a fixed shaped beam.

Next, another embodiment will be explained.

Figure 9A:
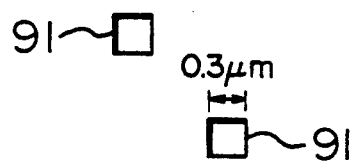
FIGS. 9A to 9C concern another embodiment of the present invention, more particularly, FIG. 9A being a diagram showing a unit pattern, FIG. 9B being a diagram showing an aperture, and FIG. 9C being a cross section of a substrate on which delineation has been made using the aperture shown in FIG. 9B.
Figure 9B:
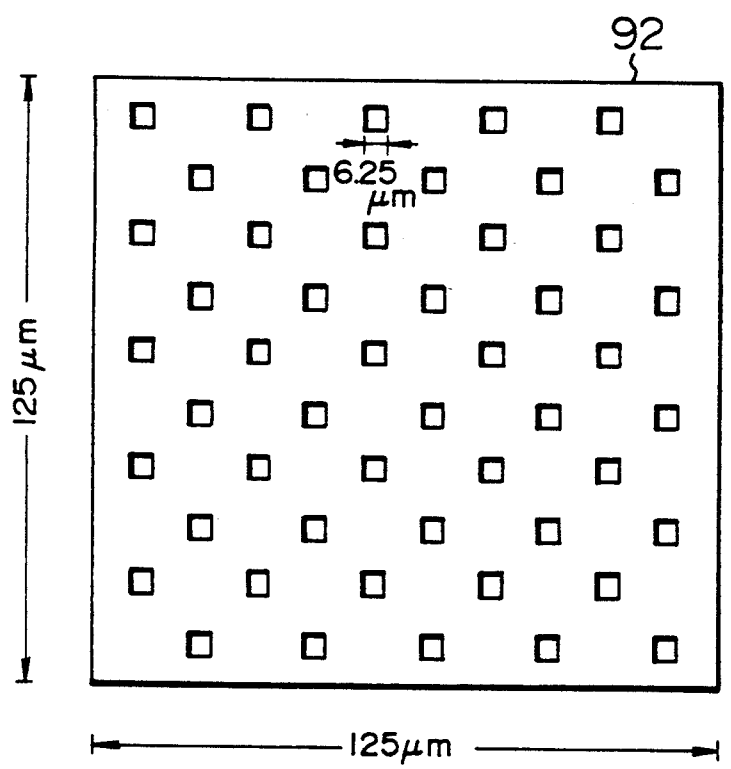

FIG. 9A shows a repetitive unit pattern 91 for memory cells of 2 bits. FIG. 9B shows an aperture plate 92 for a fixed shaped beam for realizing the patterns shown in FIG. 9A. The reduction ratio of an optical system of an electron beam lithography apparatus used in this embodiment is 1/25. Therefore, it should be noted that the size of an aperture 93 in the aperture plate 92 is increased by 25 times. In the viewpoint of design, a pattern of 0.3 μm develops into a dimension of 7.5 μm on the aperture plate. However, the pattern is formed with a dimension of 6.25 μm on the aperture plate, taking shifts in dimension upon delineation and development of an electron beam resist.

The aperture plate was fabricated as follows. On a top surface of a silicon monocrystalline substrate is formed a so-called three-layer resist structure or a structure which has the lowermost layer inclusive of underlay resist of novolak resin and spin-on-glass (SOG), an intermediate layer for improving the selectivity of etching, and an electron beam resist layer as the uppermost layer. A pattern is delineated on the electron beam resist layer of the uppermost layer. After development, the pattern is formed down into the underlay resist layer by etching. The pattern thus formed is used as a mask to etch the silicon monocrystalline substrate until a depth of about 20 μm. Next, a bottom surface side of the silicon substrate excepting the periphery portion thereof is etched to form apertures at portions etched from the top surface.

Figure 9C:
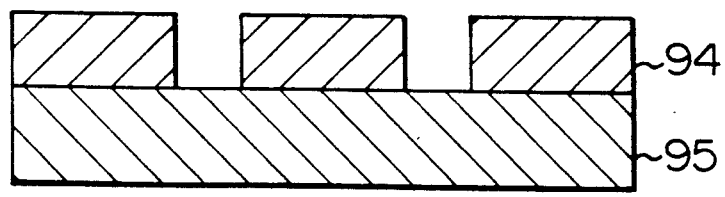

The aperture plate thus fabricated was mounted as the second aperture plate 210 of the electron beam lithography apparatus of FIG. 2 (where an acceleration voltage is 50 kV) and delineation was made on a silicon substrate 95 on which a positive type of electron beam resist 94 of 1 μm thickness containing novolak resin as a base material is applied, as shown in FIG. 9C. The exposure at this time was 80 μC/cm². Thereafter, development was conducted for 150 seconds in a 2.38% aqueous solution of tetramethylammoniumhydroxide (TMAH) to obtain a resist configuration as shown in cross section by FIG. 9C. The dimension of an aperture obtained was 0.3 μm±0.03 μm. Namely, it was possible to control the aperture dimension within an allowable error.

FIG. 10 shows a further embodiment. There is shown a memory cell pattern of a memory LSI which has a wiring pattern of 0.25 μm in design dimension. The present embodiment is an example in which delineation is performed on an electron beam resist layer of the uppermost layer of a so-called three-layer resist structure. The three-layer resist structure involves a problem that there are not only shifts in dimension upon delineation and development of the electron beam resist layer but also changes in dimension upon pattern transfer from the electron beam resist later to an intermediate layer and from the intermediate layer to an underlay resist. Therefore, it is necessary that the width of a pattern to be formed in an aperture plate for obtaining a fixed shaped beam is determined taking the above problem in consideration.

Figure 10A:
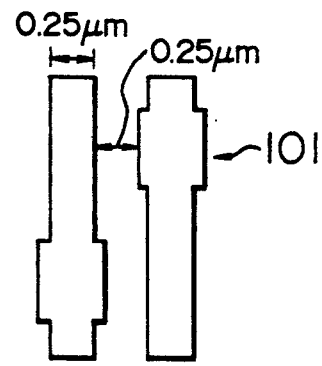
FIGS. 10A and 10B concern another embodiment of the present invention, more particularly, FIG. 10A being a diagram showing a first aperture and FIG. 10B being a plan view of an aperture plate provided with a plurality of apertures which are slightly different from each other in only aperture width and each of which includes a multiplicity of unit patterns shown in FIG. 10A though only a part of the unit pattern is shown for the convenience of illustration.
Figure 10B:
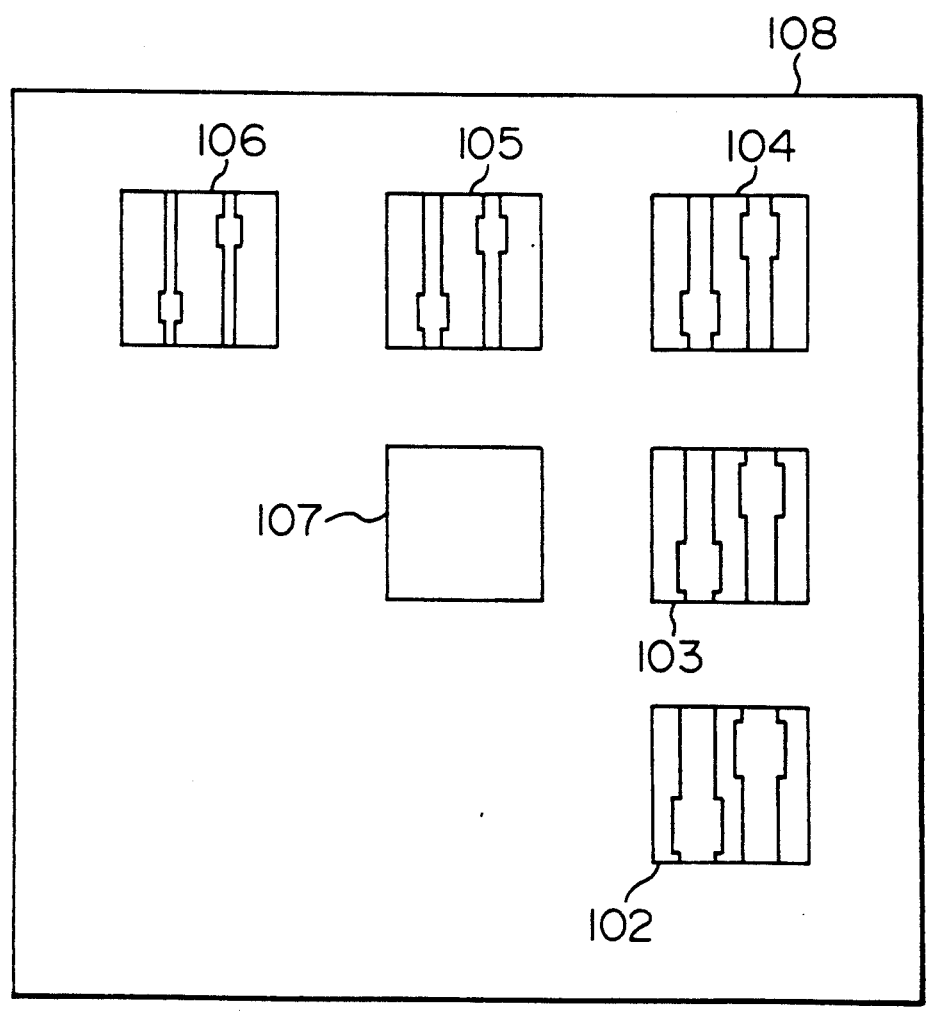

FIG. 10A shows a repetitive unit figure or pattern 101 of the memory cell pattern. The minimum dimension is 0.25 μm in both of a line width and a gap between lines. FIG. 10B is a partial plan view of the aperture plate and shows a group of apertures for fixed shaped beams. The maximum size of 250 μm square is possible for an aperture. This corresponds to a beam size of 5 μm square on a wafer since the reduction ratio of an optical system of an electron beam lithography apparatus used in the present embodiment is 1/50. Though a multiplicity of repetitive unit patterns can be arranged in each aperture in the aperture group of the aperture plate, only a part of one unit pattern is shown in FIG. 10B for simplification of illustration.

Since the reduction ratio of the optical system of the electron beam lithography apparatus used in the present embodiment is 1/50, as mentioned above, 0.25 μm on a wafer corresponds to 12.5 μm on an aperture plate. In the present embodiment, one aperture plate 108 was provided with five kinds of apertures 102, 103, 104, 105 and 106 which respectively provide 14.5 μm, 13.5 μm, 12.5 μm, 11.5 μm and 10.5 μm in pattern dimension or aperture width on an aperture plate, taking shifts in dimension upon delineation and development and upon pattern transfer in a three-layer resist structure by etching and an aperture 107 for obtaining a variable shaped beam. The aperture plate 108 is made of a silicon monocrystal. The apertures were formed through perforation of the silicon monocrystal by etching in a manner similar to that in the embodiment shown in conjunction with FIG. 9.

Figure 11:
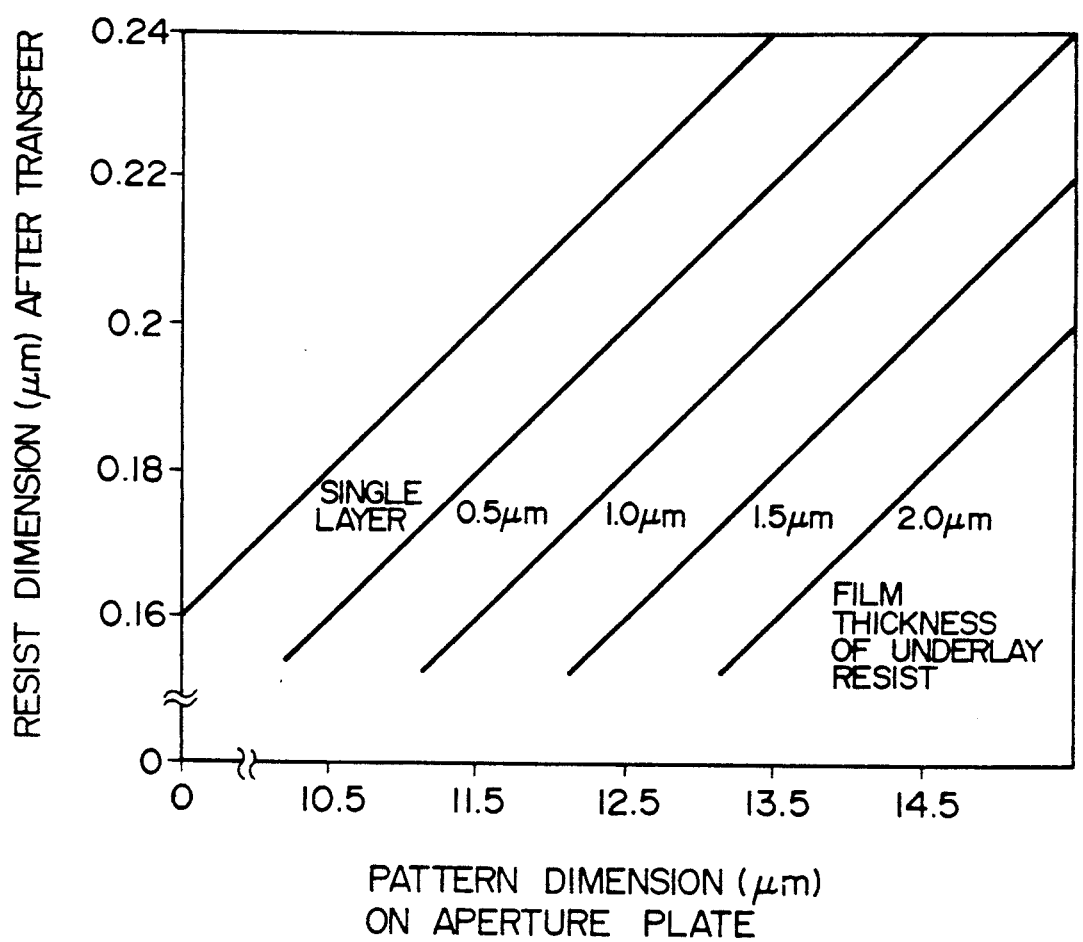
FIG. 11 is a graph showing a relationship between an aperture width and the line width of a pattern on a resist.

FIG. 11 shows a pattern dimension after the transfer of a pattern by etching in three resist layers on a wafer has been made until the underlay resist by delineation and development using the electron beam lithography apparatus having the aperture plate of the present embodiment mounted thereon. In FIG. 11, the abscissa represents a pattern dimension on the aperture plate and the ordinate represents a resist dimension after pattern transfer. In the figure, the film thickness of the underlay resist in the three-layer resist structure is taken as a parameter. Owing to side etching upon pattern transfer to the underlay resist by etching, a shift in dimension becomes somewhat large in the case where the film thickness of the underlay resist is large. In the present embodiment, since a plurality of apertures having different pattern or aperture widths are provided, it is not necessary to remake an aperture plate even if a small change is made for a working process, thereby making it possible to obtain a high-accuracy resist pattern at high speed.

Figure 12A:
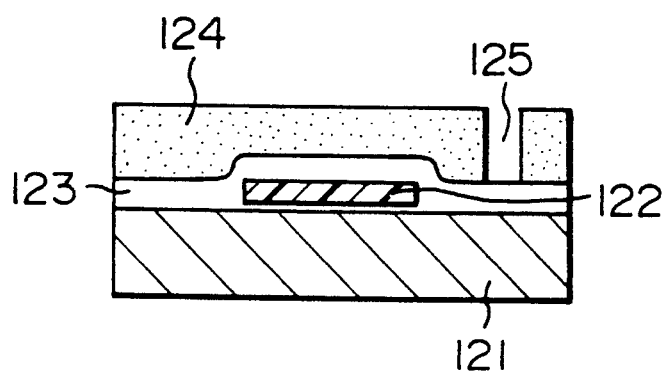
FIG. 12A is a cross section of a memory element to which a method according to an embodiment of the present invention is applied.

Next, explanation will be made of an embodiment in which contact holes for a 64 Mbit random access memory (DRAM) LSI are formed using the aperture plate shown in FIG. 9B. Excepting a step of working a fine hole configuration, the patterning was made by use of a reduced projection exposure or lithography technique using light of 365 nm wavelength. FIG. 12A is a cross section showing a memory element for one bit of a semiconductor device. A polysilicon gate 122, an insulating film 123 and an electron beam resist 124 are formed on a silicon substrate 121 in the mentioned order. In a step of patterning of the electron beam resist 124 to form a contact hole in the insulating film 23, the aperture plate shown in FIG. 9B was used to irradiate a contact hole pattern 125 with an electron beam and a configuration shown in FIG. 12A was obtained by development.

Figure 12B:
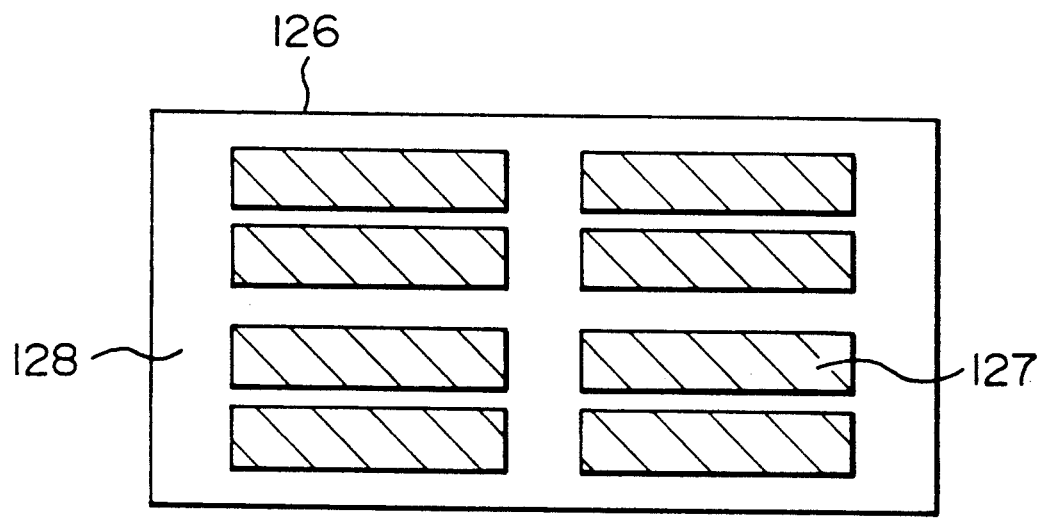
FIG. 12B is a plan view showing the whole of a chip including a multiplicity of the memory elements shown in FIG. 12A.

FIG. 12B is a plan view showing the whole of one chip of a semiconductor device having a 64 Mbit LSI. Patterns of the memory element shown in FIG. 12A are regularly arranged in memory mat portions 127 of a chip 126. A peripheral circuit portion 128, which is the remaining region, was delineated using a variable shaped beam.

Thereafter, a memory capacitor forming step and a wiring step were carried out, thereby completing the semiconductor device. In this case too, like the case of the contact holes, the patterning for working of fine hole configurations was made by an electron beam lithography using an aperture plate of the present invention and the patterning at the other steps was made using a reduced projection lithography technique.

The use of an aperture plate as shown above makes it possible to make a correction for a shift in pattern dimension which may be produced at a process for delineation and development of an electron beam resist. As a result, the patterning with high accuracy is possible.

Also, in the case where an aperture plate is provided with a plurality of apertures which have identical shapes but different correction values, a resist pattern with high accuracy can be obtained at high speed with no need of remaking an aperture plate for formation of a fixed shaped beam even in the case where a need of a change for a working process occurs.

Though the present invention has been described in detail, it should be understood that various changes, substitutions and alternation can be made hereto without departing from the spirit and scope of the present invention a defined by the appended claims.

We claim:

1. An electronic beam lithography method of delineating an array pattern only of repeated unit patterns on a substrate by use of an electron beam, comprising:
    a step of passing a first electron beam through a first aperture to form a second electron beam and making delineation on said substrate to form a part of the array pattern by use of said second electron beam, said first aperture including an array of repeated unit patterns of a predetermined shape so that the cross section of said second electron beam takes a shape substantially identical with the repetition of said unit pattern; and
    a step of passing said first electron beam through a second aperture to form a third electron beam and making delineation on said substrate to form a residual part of said array pattern by use of said third electron beam, the cross section of said third electron beam being variable by shifting the irradiation position of the first electron beam with the second aperture.

2. An electron beam lithography method according to claim 1, wherein a pattern to be delineated on said substrate by the second electron beam has a shape substantially identical with the repetition of a reduced version of said unit pattern.

3. An electron beam lithography method according to claim 2, wherein the pattern t be delineated on said substrate by the second electron beam has a shape substantially identical with the repetition of a reduced version of the shape of said first aperture.

4. An electron beam lithography method of delineating a pattern on a substrate by use of an electron beam, comprising:
    a step of passing a first electron beam and making delineation on said substrate to form at least a part of array patterns of repeated unit patterns by use of said second electron beam, said first aperture including an array of repeated unit patterns of a predetermined shape so that the cross section to the axis of said second electron beam takes a shape substantially identical to the repetition of sad unit pattern; and
    a step of passing said first electron beam through a second aperture to form a third electron beam and making delineation on said substate to form a residual part of said array patterns by use of said third electron beam, the cross section of said third electron beam being variable by shifting the irradiation position of the first electron beam with the second aperture, wherein sad second electron beam makes delineation on a first predetermined region of said substrate and said third electron beam makes delineation on a second predetermined region of said substrate which is different from said first predetermined region, said first predetermined region is a region where a proximity effect is substantially uniform, and said second predetermined region is a region where the proximity effect is not uniform.

5. An electron beam lithography method according to claim 4, wherein said second predetermined region is adjacent to a region of said substrate where no pattern is to be included.

6. An electron beam lithography method of delineating a pattern on a substrate by use of an electron beam, comprising:
    a step of passing a first electron beam and making delineation on said substrate to form at least a part of array patterns of repeated unit patterns by use of said second electron beam, said first aperture including an array of repeated unit patterns of a predetermined shape so that the cross section to the axis of said second electron beam takes a shape substantially identical to the repetition of said unit pattern; and
    a step of passing said first electron beam through a second aperture to form a third electron beam and making delineation on said substrate to form a residual part of said array patterns by use of said third electron beam, the cross section of said third electron beam being variable by shifting the irradiation position of the first electron beam with the second aperture, wherein said first aperture includes the maximum number of repeated unit patterns which can be arranged in a range where said first electron beam has a uniform current density.

7. An electron beam lithography method of delineating a pattern on a substrate by use of an electron beam, comprising:
    a step of passing a first electron beam and making delineation on said substrate to form at least a part of array patterns of repeated unit patterns by use of said second electron beam, said first aperture including an array of repeated unit patterns of a predetermined shape so that the cross section of said second electron beam takes a shape substantially identical to the repetition of said unit pattern; and
    a step of passing said first electron beam through a second aperture to form a third electron beam and making delineation on said substrate to form a residual part of said array patterns by use of said third electron beam, the cross section of said third electron beam being variable by shifting the irradiation position of the first electron beam with the second aperture, wherein said first aperture includes the array of repeated unit patterns the number of which is 1/m of the number of repeated reduced unit patterns forming a pattern to be delineated on said substrate, m being a natural number.

8. An electron beam lithography method according to claim 5, wherein the exposure of said third electron beam is adjustable.

9. An electron beam lithography method according to claim 7, wherein said first aperture includes the maximum number of repeated unit patterns which can be arranged in a range where said first electron beam has a uniform current density.

10. An electron beam lithography method of delineating a pattern on a substrate by use of an electron beam, comprising:
   a step of passing a first electron beam and making delineation on said substrate to form at least a part of array patterns of repeated unit patterns by use of said second electron beam, said first aperture including an array of repeated unit patterns of a predetermined shape so that the cross section to the axis of said second electron beam takes a shape substantially identical to the repetition of said unit pattern; and
   a step of passing said first electron beam through a second aperture to form a third electron beam and making delineation on said substrate to form a residual part of said array patterns by use of said third electron beam, the cross section of said third electron beam being variable by shifting the irradiation position of the first electron beam with the second aperture, wherein there are provided a plurality of said first apertures the widths of which are slightly changed from each other and one among said plurality of first apertures is selected to form said second electron beam.

11. An electron beam lithography method according to claim 10, wherein the width of the change in aperture width corresponds to the magnitude of 0.02 $\mu$m to 0.2 $\mu$m when projected onto said substrate.

12. An electron beam lithography apparatus for delineating a pattern on a substrate by use of an electron beam, comprising:
   an electron beam source for emitting a first electron beam;
   means for passing said first electron beam through a first aperture to form a second electron beam and making delineation on said substrate by use of said second electron beam, said first aperture including an array of repeated unit patterns of a predetermined shape so that the cross section of said second electron beam takes a shape substantially identical with the repetition of said unit pattern; and
   means for passing said first electron beam through a second aperture to form a third electron beam and making delineation on said substrate by use of said third electron beam, the cross section of said third electron beam being variable by shifting the irradiation position of the first electron beam with the second aperture, wherein said first aperture is formed in an aperture plate and said aperture plate is provided with at least one aperture which is different from said first aperture in only aperture width.

13. An electron beam lithography apparatus according to claim 12, wherein a difference in aperture width between said aperture and said aperture different from said first aperture is set such that it corresponds to 0.2 $\mu$m to 0.2 $\mu$m when the shape of the aperture is projected onto said substrate.

14. An aperture plate having an aperture for defining an electron beam with which a substrate is irradiated, the aperture plate being incorporated in an electron beam lithography apparatus, said aperture plate comprising:
   a primary aperture which includes an array of repeated unit patterns of a predetermined shape; and
   at least one aperture which is different from said primary aperture in only aperture width.

15. An aperture plate according to claim 14, wherein a difference in aperture width between said primary aperture and said aperture different from said primary aperture is set such that it corresponds to 0.02 $\mu$m to 0.2 $\mu$m when the shape of the aperture is projected onto said substrate.

16. An electron beam lithography method of delineating on a substrate a pattern area which includes an effective pattern region and an auxiliary pattern region formed in contiguity to the substantially entire circumference or at least one of sides of said effective pattern region, comprising:
   a step of designing said auxiliary pattern region so that the shape of a pattern included in said pattern area to be delineated can be formed by the repetition of a reduced version of the shape of an aperture; and
   a step of passing a first electron beam through said aperture to form a second electron beam and delineating said pattern area on said substrate by use of said second electron beam, said aperture including an array of repeated unit patterns of a predetermined shape, and the number of repeated unit patterns in said aperture being selected to be the maximum in a range where said first electron beam has a uniform current density.

17. An electron beam lithography method of delineating an array pattern of repeated unit patterns on a substrate by use of an electron beam, comprising:
   a step of passing a first electron beam through an aperture to form a second electron beam and making delineation on said substrate to form a part of the array pattern by use of said second electron beam, said aperture including an array of repeated unit patterns of a predetermined shape so that the cross section of said second electron beam takes a shape substantially identical with a repetition of said unit patterns; and
   a step of passing said first electron beam through only a part of said aperture to form a third electron beam and making delineation on said substrate to form a residual part of said array pattern by use of the third electron beam, the cross section of said third electron beam having a shape substantially identical with a repetition of said unit patterns with a fewer number of said repeated unit patterns than that of said second electron beam.

18. An aperture plate used for delineating a pattern array of repeated unit patterns on a substrate, the aperture plate being provided with an aperture which defines a first electron beam emitted from an electron beam source, the aperture plate being adapted to be incorporated in an electron beam lithography apparatus, in which said aperture includes an array of repeated unit patterns each of which is an enlarged version of the unit pattern in said pattern array, and the number of the repeated unit patterns included in said aperture is 1/m of the number of the repeated unit patterns included in said pattern array to be delineated on the substrte, m being a natural number.

19. An aperture plate according to claim 18, wherein said aperture has the maximum rear in a range where said first electron beam has a uniform current density.

* * * * *